United States Patent [19]

Todokoro et al.

[11] Patent Number: 4,626,690
[45] Date of Patent: Dec. 2, 1986

[54] APPARATUS FOR CHOPPING A CHARGED PARTICLE BEAM

[75] Inventors: Hideo Todokoro; Tsutomu Komoda, both of Tokyo, Japan

[73] Assignee: Hitachi, Ltd., Tokyo, Japan

[21] Appl. No.: 672,203

[22] Filed: Nov. 16, 1984

[30] Foreign Application Priority Data

Nov. 21, 1983 [JP] Japan .................. 58-217724

[51] Int. Cl.⁴ .............................. H01J 3/14
[52] U.S. Cl. ................... 250/396 R; 250/398
[58] Field of Search ........... 250/356 R, 356 ML, 310, 250/306, 397, 398; 313/361.1

[56] References Cited

U.S. PATENT DOCUMENTS 4,110,623  8/1978  Azam et al. ................. 250/398
4,151,417  4/1979  Takigawa ................. 250/396 R
4,169,229  9/1979  Feuerbaum ................. 250/396 R
4,439,685  3/1984  Plies ................. 250/398
4,445,041  4/1984  Kelly ................. 250/396 R Primary Examiner—Bruce C. Anderson
Attorney, Agent, or Firm—Antonelli, Terry & Wands

[57] ABSTRACT

An apparatus for chopping a charged particle beam comprises: deflecting means for deflecting a charged particle beam by a high frequency voltage; deflecting means for deflecting the charged particle beam by a DC voltage or low frequency saw-tooth voltage in the same deflecting direction as the high frequency deflecting means does; and aperture means for taking out only a part of the charged particle beam deflected. The generation time point of the pulse beam which is generated at a high frequency is arbitrarily adjusted by the DC voltage or low frequency saw-tooth voltage.

4 Claims, 16 Drawing Figures

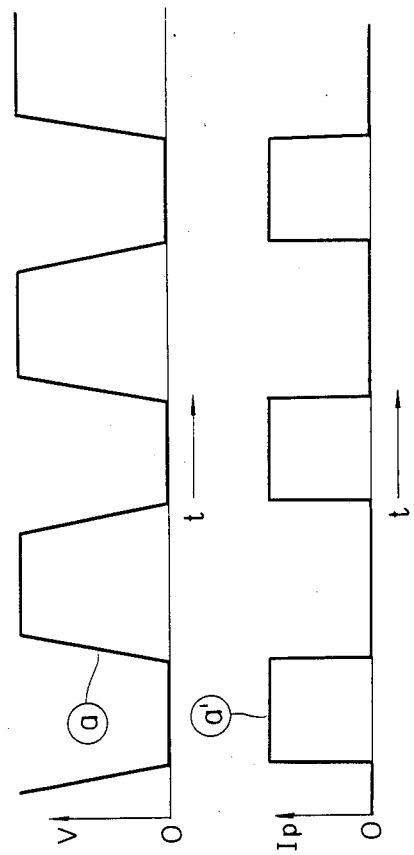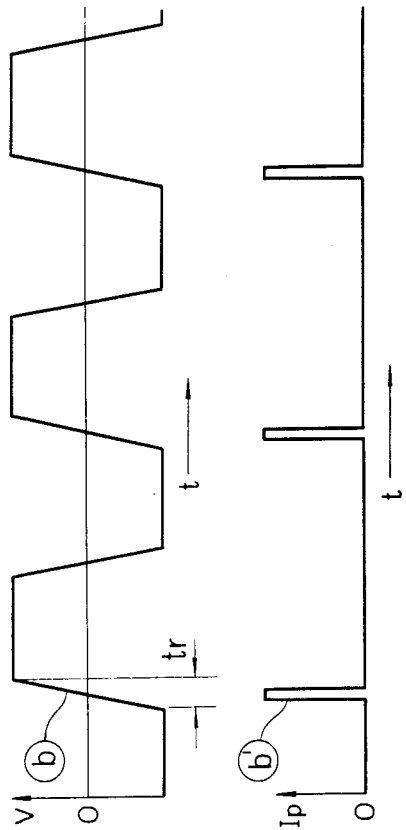
FIG. 5A
FIG. 5B
FIG. 5C
FIG. 5D

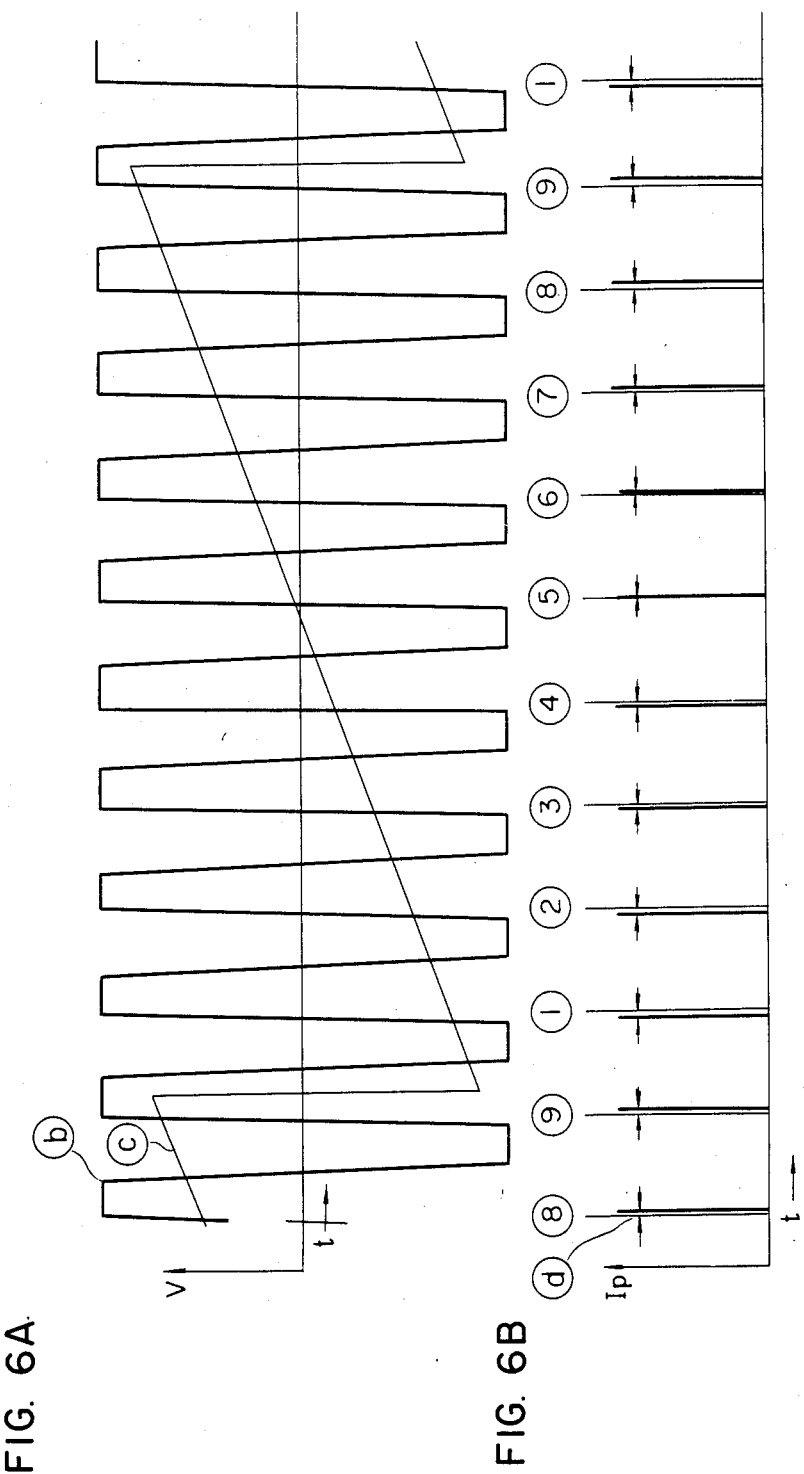

APPARATUS FOR CHOPPING A CHARGED PARTICLE BEAM

BACKGROUND OF THE INVENTION

The present invention relates to an apparatus for chopping a charged particle beam and, more particularly, to an apparatus for chopping an electron beam which is suitable for use in a stroboscopic scanning electron microscope.

Stroboscopic scanning electron microscopes are constituted by an ordinary scanning electron microscope and a beam chopper and synchronous circuit added thereto. This microscope will be described hereinbelow with reference to the drawings. FIG. 1 is a diagram showing a fundamental arrangement of a stroboscopic scanning electron microscope. An electron beam 2 emitted from an electron gun 1 is focused on a sample 10 using an electron lens 6 and is caused to scan rectangularly by a scanning coil 8 in the same manner as the scanning is performed in an image pickup tube of a television set. When the electron beam collides with a solid, a secondary electron or a reflection electron is emitted therefrom. This secondary electron or reflection electron is detected by a detector 9 and in response to the intensity of the detected signal, an image of the sample is displayed on a display device 7 which operates synchronously with the scanning coil 8. This is a fundamental principle of the scanning electron microscope.

However, in the case where a sample (for example, an integrated circuit IC or the like) which is changing at high speeds is observed by this scanning electron microscope, the scanning velocity cannot follow the changing speed of the sample, so that the whole change of the sample will have been overlapped and displayed. In view of the above situation, the electron beam is controlled so that it is deflected by imparting to a deflecting plate 3 an output of a pulse circuit 12 synchronized with a driver 11 which causes the change in the sample change (for instance, in position such as A, B and C in FIG. 1). The electron beam passes downwardly through an aperture 4 only when it is deflected on an opening of the aperture 4, and thus the electron beam is chopped here. By scanning the sample with such a chopped electron beam, the electron beam is irradiated only at a constant phase point in the sample change; consequently, only an image at a certain time point (phase) in the sample condition can be selectively displayed without causing the overlap of the whole movement. This is the stroboscopic scanning electron microscope (refer to G. S. Plows and W. C. Nixon; "Stroboscopic Scanning Electron Microscopy", J. Phys. E., Ser. II, pp 595–600, 1968).

A delay circuit 5 is provided between the pulse oscillator 12 and the driver 11 in order to observe the whole sample change by use of the above-mentioned method. FIG. 2 shows a circuit for generating a delay which is most generally used. A trigger pulse from the driver 11 is inputted to a terminal 16. In response to this trigger pulse, a saw-tooth oscillator 13 generates a saw-tooth wave synchronized with the driver 11. This saw-tooth wave is inputted to one input of a phase shifter 15. An output from a DC power source 14 is inputted to the other input. An output of the DC power source 14 is controlled manually or by a computer. The phase shifter 15 compares those two inputs and generates a pulse when their levels coincide. FIGS. 3A to 3C show the time relation between those signals. In FIG. 3A, a denotes a trigger pulse which is inputted to the saw-tooth oscillator 13. In FIG. 3B, b indicates an output of the saw-tooth oscillator 13 and c represents an output of the DC power source 14. In FIG. 3C, d is an output from the phase shifter 15. A time delay of td is caused between a and d. This td can be set to an arbitrary value by changing a level of c.

However, the minimum time $\Delta t$ which can be controlled by the phase shifter 15 is determined by a noise $\Delta Vs$ of the saw-tooth wave, a noise $\Delta Vd$ of the DC voltage and a jitter $\Delta tp$ of the phase shifter. Assuming that the rise time of the saw-tooth wave is k(ns/V), $\Delta t$ will become $$\Delta t = k \cdot \sqrt{\Delta Vs^2 + \Delta Vd^2} + \Delta tp$$

$\Delta Vd$ can be ignored since it is smaller than $\Delta Vs$. When it is assumed that $\Delta Vs$ is 10 mV and k is 0.2, $k \cdot \Delta Vs$ will become 20 ps. Although $\Delta tp$ differs depending upon components used in the phase shifter, it is at least 20 to 30 ps and, as a whole, $\Delta t$ can not be made shorter than about 50 ps.

Although the limitation imposed on the phase shifter has been described, it is said that about 50 ps is the limit when a delay line is used. This is due to a difficulty in adjusting the delay line which has a length on the order of millimeters. A variation in length of terminals of a sample, for example, an IC is at least over three millimeters, so that this causes a variation in delay amount of 20 ps.

SUMMARY OF THE INVENTION

It is an object of the present invention to provide an apparatus for chopping a charged particle beam which can control more minute periods of time than the above-mentioned limit.

To attain the above object, the present invention intends to perform the function of the phase shifter mentioned above by use of deflection of an electron beam and comprises: deflecting means for deflecting an electron beam or, in general, a charged particle beam by a high frequency voltage; deflecting means for deflecting such a beam by a DC voltage or a low frequency saw-tooth voltage in the same deflecting direction that the high frequency deflecting means does; and aperture means for taking out only a part of the deflected charged particle beam, wherein the generation time point of the pulse beam which is generated at a high frequency is arbitrarily adjusted by the DC voltage or low frequency saw-tooth voltage.

BRIEF DESCRIPTION OF THE DRAWINGS

FIGS. 5A to 5D are waveform diagrams for explaining a principle of a chopping operation in the embodiment of FIG. 4.

FIGS. 6A and 6B are waveform diagrams for explaining a principle of a delay in the invention.

DESCRIPTION OF THE PREFERRED EMBODIMENTS

The present invention will now be described hereinbelow with reference to embodiments.

Figure 1:
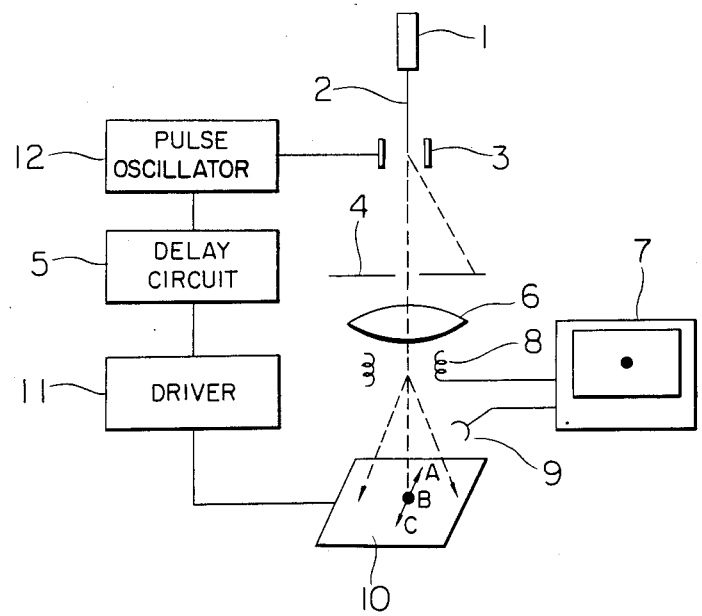
FIG. 1 is a block diagram for explaining a principle of a stroboscopic scanning electron microscope.
Figure 2:
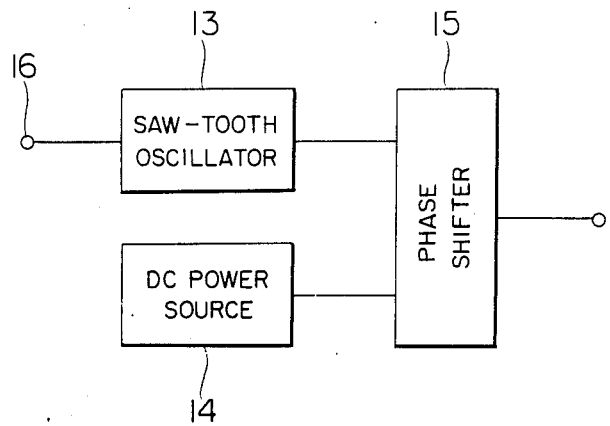
FIG. 2 is a block diagram showing a circuit for generating a delay.
Figure 3:
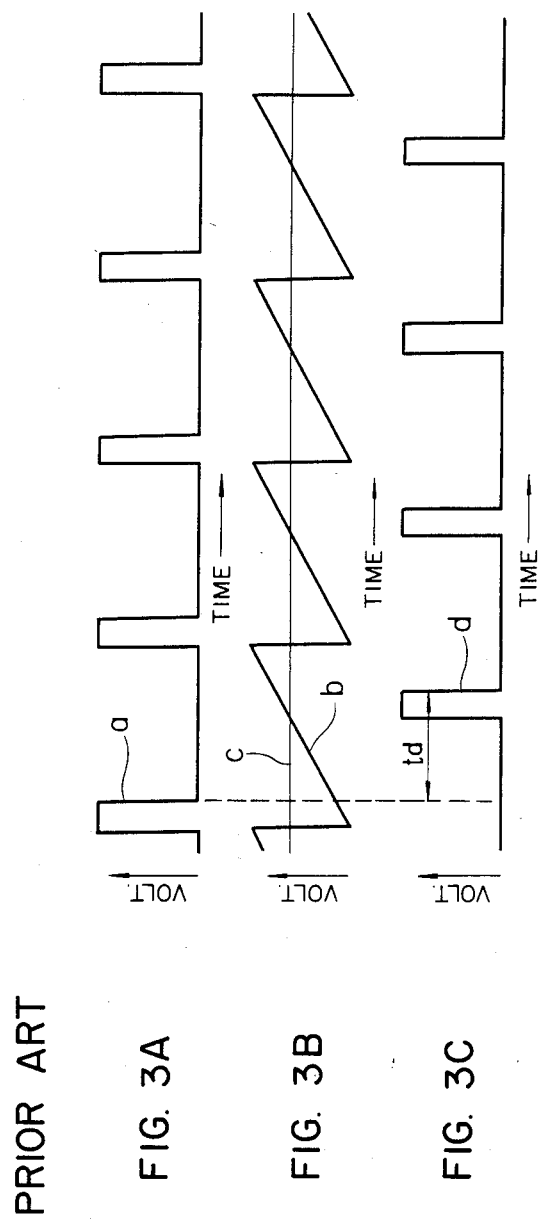
FIGS. 3A to 3C are waveform diagrams for explaining a principle of the delay.
Figure 4:
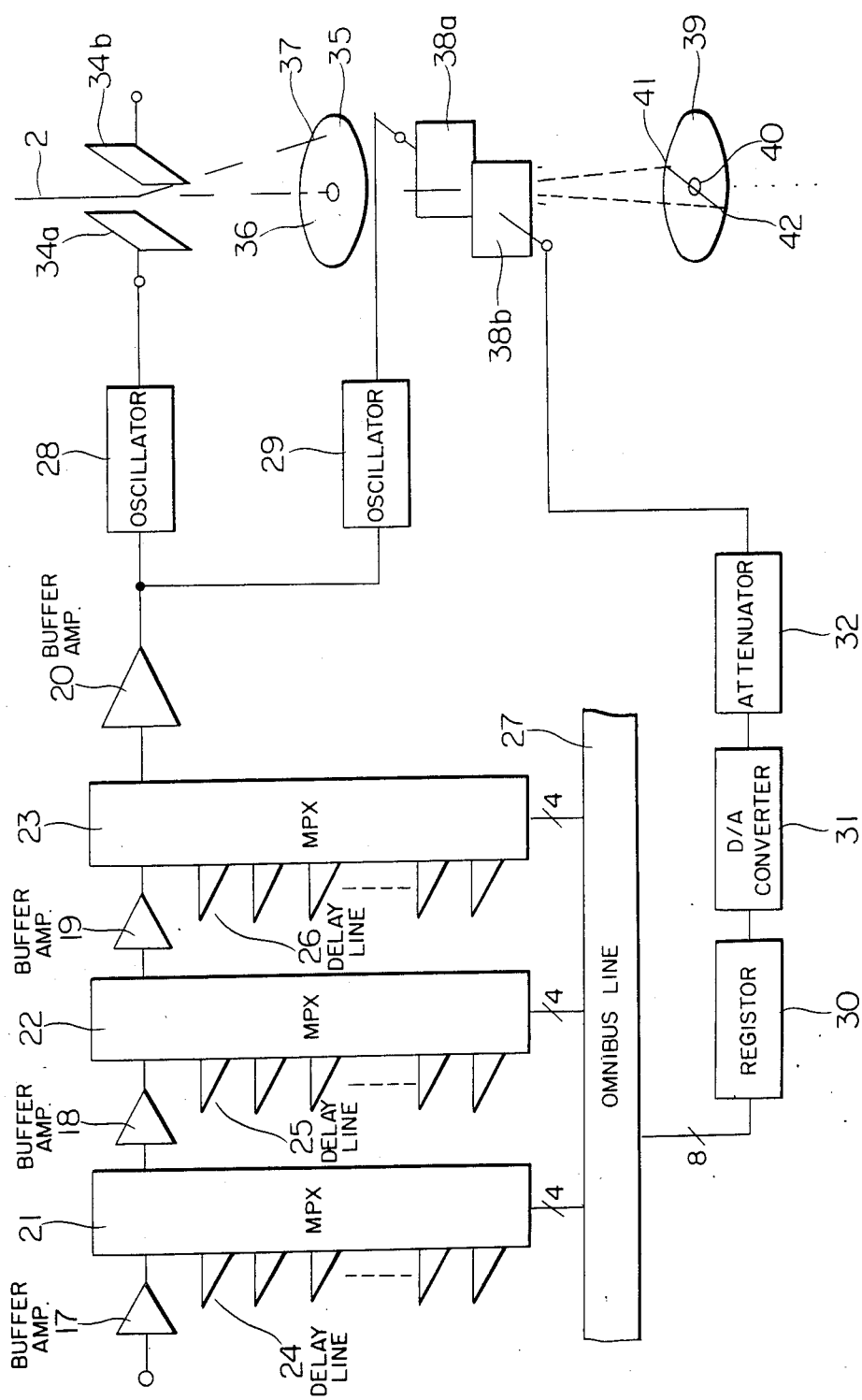
FIG. 4 is a block diagram showing one embodiment of the present invention.

FIG. 4 is a diagram showing one embodiment of a delay circuit of the present invention which has a total delay amount of 409.6 ns and the minimum control time of 10 ps, and which is constructed such that the delay of a longer time above 0.1 ns (100 ps) is provided by a combination of delay lines and the delay under 100 ps is provided by deflection of an electron beam according to the invention.

First, a delay circuit by delay lines will be described. A trigger pulse from the sample driver 11 is inputted to a buffer amplifier 17 of the delay circuit. The buffer amplifier is followed by three columns of multiplexers 21, 22 and 23. Buffer amplifiers 18 and 19 are provided between the respective multiplexers and a buffer amplifier 20 is provided at an output of the multiplexer 23. Each of the multiplexers 21, 22 and 23 consists of four bits and is controlled through an omnibus line 27 of a CPU. The multiplexer 21 at the first stage is equipped with fifteen delay lines 24 each having the delay amount of 0.1 ns (100 ps). The multiplexer 22 at the middle stage is equipped with fifteen delay lines 25 each having the delay amount of 1.6 ns. The multiplexer 23 at the final stage is equipped with fifteen delay lines 26 each having the delay amount of 25.6 ns. By combining these delay lines, the total delay amount of 409.6 ns is obtained.

Next, an arrangement to chop an electron beam (or charged particle beam) by the delayed trigger pulse will be explained. Two deflecting plates are used to produce one pulse beam at every period. A Y-axis aperture 35 is disposed below upper Y-axis deflecting plates 34a and 34b. An X-axis aperture 39 is disposed below lower X-axis deflecting plates 38a and 38b. Voltages of waveforms such as shown in FIGS. 5A and 5C are applied to these deflecting plates. In FIG. 5A, ⓐ denotes an output of an oscillator 28. In FIG. 5C, ⓑ indicates an output of an oscillator 29. These oscillators 28 and 29 are driven by the trigger pulse which is generated through the delay circuit. The output ⓐ is applied to the Y-axis deflecting plate and the output ⓑ is applied to the X-axis deflecting plate. The electron beam reciprocates between an opening 36 and a peripheral portion 37 on the Y-axis aperture 35 by the Y-axis deflecting plates 34a and 34b. Thus, the electron beam passing through the opening 37 in the Y-axis aperture 35 becomes the pulse beam having the duty of about 50% as indicated at ⓐ' in FIG. 5B. This electron beam is further deflected by the X-axis deflecting plates 38a and 38b. This deflection causes the electron beam to reciprocate between two points 41 and 42 on the X-axis aperture 39. When the voltage to the deflecting plate crosses a zero point, the electron beam passes through an aperture 40 in the X-axis aperture 39. Thus, the electron beam which passed through the X-axis aperture 39 becomes very short pulses as indicated at ⓑ' in FIG. 5D and this pulse beam is generated once at every period of the deflecting voltage. For instance, in the case of the electron beam of an accelerating voltage of 1 kV, now assuming that the electrode distance between the X-axis deflecting plates 38a and 38b is 2 mm, the length of the electrode is 12 mm, the distances between the X-axis deflecting plates 38a and 38b and the X-axis aperture 39 is 50 mm, and the diameter of opening 40 is 30 μm, the pulse beam of 0.1 ns will be derived when the rectangular wave having the rise time of 2.5 ns ($t_r$ in FIG. 5C) is used.

Since the pulse beam has the pulse width of 0.1 ns, it is desirable to control the delay time which is further shorter by a factor of 10. However, there is the limit when the delay lines or phase shifter is used as already mentioned. Therefore, the delay by means of the deflection of the electron beam of the invention is made to eliminate this limit.

This operation will be explained hereinbelow with reference to FIG. 4 again. The saw-tooth voltage (or DC voltage) of low frequency (for example, 0.05 Hz) is applied to the electrode 38b of the X-axis deflecting plate. This saw-tooth voltage is obtained such that a register 30 of, e.g., four bits is operated through the omnibus line 27 of the CPU and an output signal of the register 30 is converted to an analog signal by a D/A converter 31. This analog output is finely adjusted by an attenuator 32. This voltage is set to, e.g., 0.2 V. FIG. 6A shows the relation between a high frequency voltage waveform ⓑ (e.g., 10 MHz to 50 MHz) which is applied to the X-axis deflecting plate 38a and a waveform ⓒ at the electrode 38b of the X-axis deflecting plate. When the waveforms ⓑ and ⓒ coincide, the deflection amount of the electron beam zero, so that it passes through the opening 40. ⓓ in FIG. 6B indicates the time when the electron beam passes through the opening 40. For instance, the waveform ⓑ has the amplitude of 5 V and the rise time of 2.5 ns, while the waveform ⓒ has the amplitude of 0.2 V. During the interval when the pulse beam (indicated by fat lines in FIG. 6B) progresses from ① to ⑨, the generation time point changes from (−50 ps) to (+50 ps) with respect to a reference time (indicated by thin lines in FIG. 6B). The minimum time resolution is mainly determined by the noise (up to 10 mV) of the waveform ⓒ; it is 10 ps. As described above, the use of this circuit makes it possible to realize the delay in a range of 100 ps with the time resolution of 10 ps. By combining the delay of 100 ps and the delay due to the delay lines, the delay of up to 409.6 ns can be continuously produced.

Figure 7:
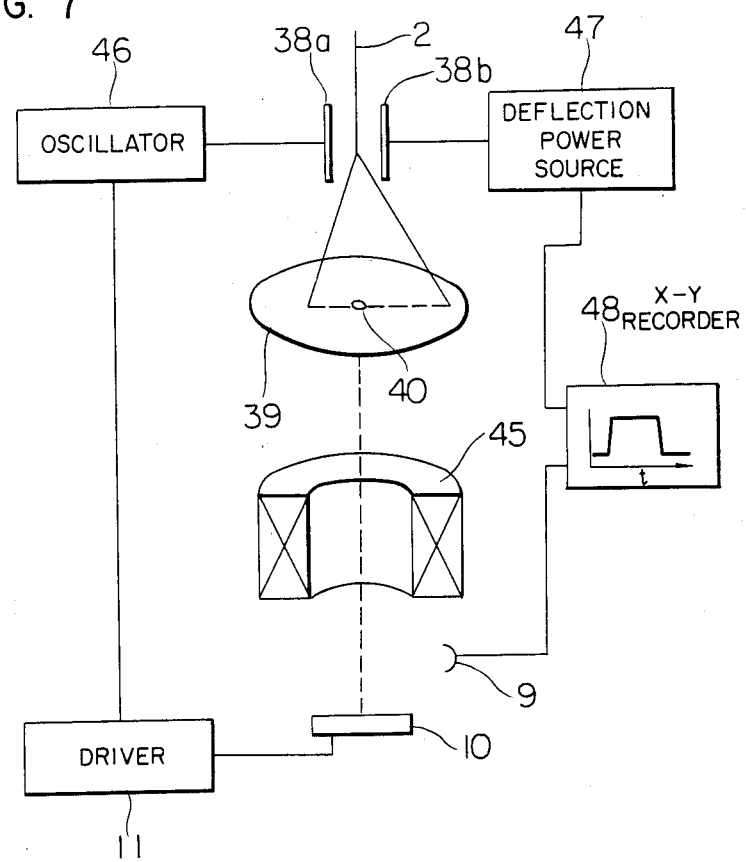
FIG. 7 is a diagram showing another embodiment of the invention.
Figure 8A:
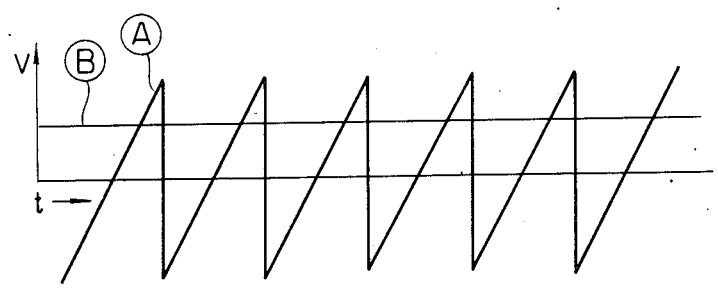
FIGS. 8A and 8B are waveform diagrams for explaining a principle of a delay which is performed in the embodiment of FIG. 7.
Figure 8B:

FIG. 7 shows another embodiment of the invention. A feature of the embodiment is that a stroboscopic scanning electron microscope can be realized by a simple construction. In the embodiment, only one deflecting plate may be used. The saw-tooth voltage which was synchronized with the trigger pulse from the sample driver is oscillated by an oscillator 46 and is applied to the electrode 38a of the deflecting plate. The DC power source from a deflection power source 47 or the low frequency output from the saw-tooth oscillator is applied to the other electrode 38b of the deflecting plate. FIGS. 8A and 8B show a state of the pulse beam generation at this time. A saw-tooth voltage Ⓐ shown in FIG. 8A at the electrode 38a of the deflecting plate lies within a range from 0 to 5 V. When the voltage at the electrode 38b of the deflecting plate is set to 2.5 V, the electron beam passes through the opening 40 in the aperture 39 at times $t_1, \ldots, t_{12}$. This state is indicated at Ⓒ in FIG. 8B. Although the saw-tooth wave Ⓐ slowly rises, it rapidly falls, so that the pulse beams at $t_1$, $t_3, t_5, \ldots$, and $t_{11}$ are sufficiently stronger than the pulse beams at $t_2, t_4, \ldots$, and $t_{12}$. Therefore, the signal due to the pulse beams at $t_1, t_3, \ldots$, and $t_{11}$ are dominant, so that there is no need to provide the Y-axis deflecting plate as in the example of FIG. 4. By changing a DC voltage Ⓑ in FIG. 8A, the generation time point of the pulse beam can be arbitrarily changed. Assuming that this voltage is the low frequency saw-tooth wave, the voltage waveform can be recorded in an X-Y recorder 48. At this time, the saw-tooth voltage is indicated on the X-axis of the X-Y recorder 48, while the output of the secondary electron detector 9 is indicated on the Y-axis.

Figure 9:
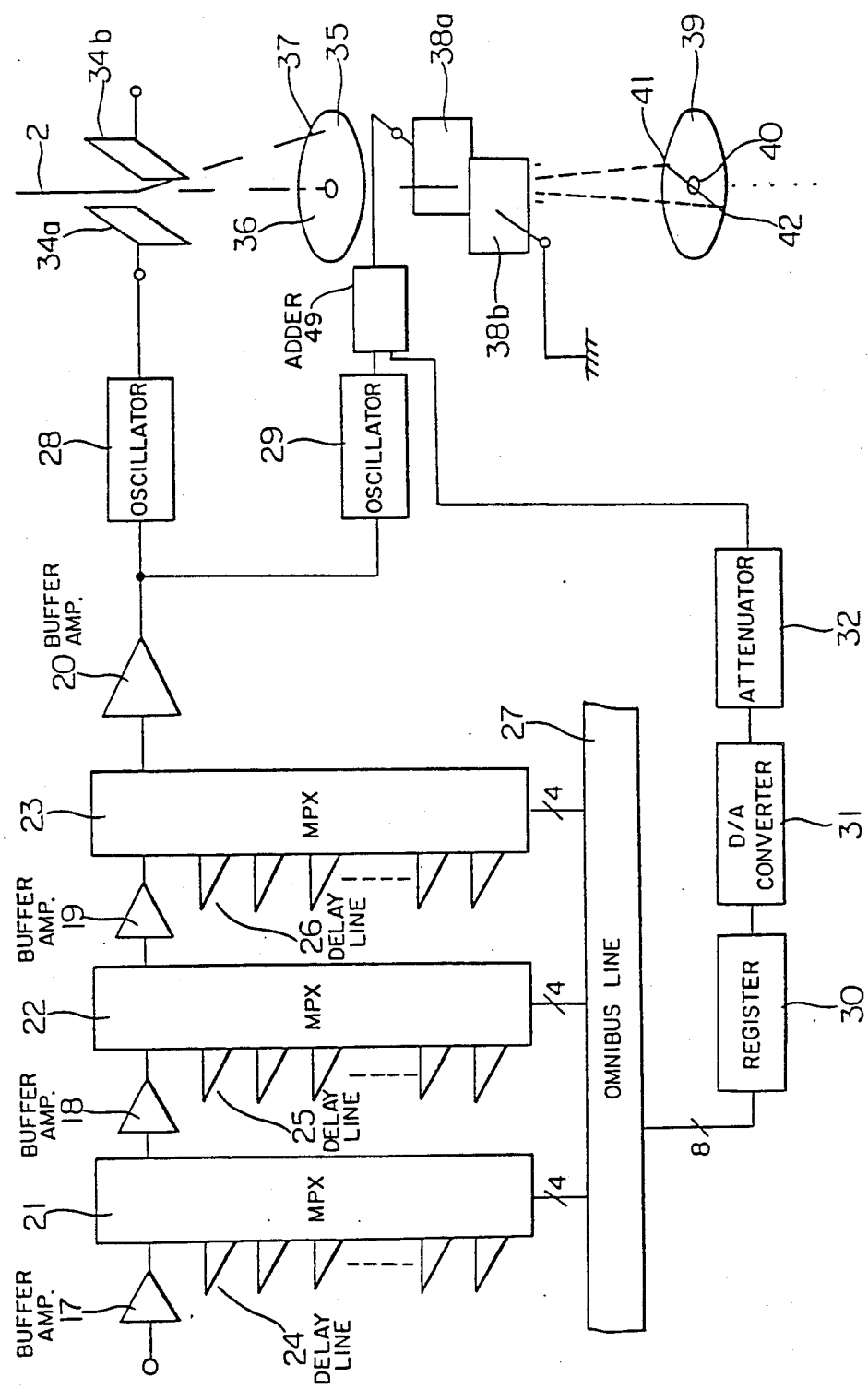
FIG. 9 is a block diagram showing another embodiment of the invention.

Although the X-axis deflecting means has been made operative by the deflecting means using a pair of deflecting plates 38a and 38b in the foregoing embodiment, in this invention, the deflection may be performed by individually providing deflecting means for high frequency and deflecting means for low frequency or direct current in the same direction. On the other hand, as the X-axis deflecting means, it is also possible to add a low frequency saw-tooth voltage or DC voltage to a high frequency voltage and to apply the resultant voltage to the X-axis deflecting means. In this case, the resultant voltage may be applied to one of the pair of deflecting means and the other of the pair may be grounded. More particularly, with reference to FIG. 9, the outputs of the oscillator 29 and attenuator 32 are fed to an adder 49 so as to be added to one another. The output of the adder 49 is transmitted to the deflection plate 38a. The deflection plate 38b is grounded.

Further, in the foregoing embodiment, both X-axis deflecting means 38a and 38b have been constituted by the electrostatic deflecting plates. However, the deflecting means for high frequency may be constituted by the electrostatic type and the deflecting means for low frequency or direct current may be constituted by the magnetic field type.

As described above, according to the invention, it is possible to control the time less than 50 ps that was impossible by a conventional method. In addition, not only the control for a short time but also a very simple stroboscopic scanning electron microscope can be realized by use of the invention in place of a conventional method.

We claim:

1. An apparatus for chopping a charged particle beam comprising:
    first deflecting means for deflecting a charged particle beam in a predetermined direction by a high frequency voltage;
    second deflecting means for deflecting said charged particle beam by a DC voltage or low frequency saw-tooth voltage in the same deflecting direction as said predetermined direction; and
    aperture means for taking out only a part of the charged particle beam which was deflected by said first and second deflecting means.

2. An apparatus according to claim 1, wherein said first and second deflecting means are constituted by a pair of electrostatic deflecting plates which face one another.

3. An apparatus according to claim 1, wherein said first deflecting means is constituted by an electrostatic type deflecting plate and said second deflecting means is constituted by a magnetic field type deflecting plate.

4. An apparatus for chopping a charged particle beam comprising:
    deflecting means for deflecting a charged particle beam in a predetermined direction by a voltage which comprises a DC voltage or low frequency saw-tooth voltage added to a high frequency voltage, wherein said deflecting means is constituted by a pair of electrostatic deflecting plates which face one another, and further wherein said voltage is provided to one of said deflecting plates and the other of said deflecting plate is grounded; and
    aperture means receiving said charged particle beam after it has been deflected by said charged particle beam for taking out only a part of the charged particle beam which was deflected by said deflecting means.

* * * * *